United States Patent
Lee et al.

(10) Patent No.: US 8,143,656 B2
(45) Date of Patent: Mar. 27, 2012

(54) HIGH PERFORMANCE ONE-TRANSISTOR DRAM CELL DEVICE AND MANUFACTURING METHOD THEREOF

(75) Inventors: Jong-Ho Lee, Daegu (KR); Ki-Heung Park, Gwacheon-Si (KR)

(73) Assignee: SNU R&DB Foundation (KR)

( * ) Notice: Subject to any disclaimer, the term of this patent is extended or adjusted under 35 U.S.C. 154(b) by 407 days.

(21) Appl. No.: 12/200,929

(22) Filed: Aug. 28, 2008

(65) Prior Publication Data
US 2010/0102372 A1 Apr. 29, 2010

(30) Foreign Application Priority Data
Aug. 28, 2007 (KR) .................. 10-2007-0086516

(51) Int. Cl.
*H01L 29/94* (2006.01)
(52) U.S. Cl. .............................. 257/298; 257/E27.084
(58) Field of Classification Search .................. 257/298, 257/E27.084
See application file for complete search history.

(56) References Cited

U.S. PATENT DOCUMENTS

| | | | | |
|---|---|---|---|---|
| 6,054,734 | A * | 4/2000 | Aozasa et al. | 257/315 |
| 6,538,916 | B2 * | 3/2003 | Ohsawa | 365/149 |
| 6,943,083 | B2 * | 9/2005 | Forbes | 438/259 |
| 7,239,549 | B2 | 7/2007 | Fazan et al. | |
| 2006/0221670 | A1 * | 10/2006 | Forbes et al. | 365/149 |
| 2007/0047371 | A1 * | 3/2007 | Park et al. | 365/230.06 |

FOREIGN PATENT DOCUMENTS

| | | |
|---|---|---|
| JP | 2002-343886 A1 | 11/2002 |
| KR | 2002-0067649 A1 | 8/2002 |
| KR | 10-0490654 B2 | 5/2005 |
| KR | 10-0675516 B2 | 1/2007 |

OTHER PUBLICATIONS

Arvind Kumar, "Scaling of Flash NVRAM to 10's of nm by Decoupling of Storage From Read/Sense Using Back-Floating Gates," IEEE Transactions on Nanotechnology, vol. 1, No. 4, Dec. 2002, p. 247.

Chang Woo Oh et al., "Floating Body DRAM Characteristics of Silicon-On-ONO (SOONO) Devices for System-on-Chip (SoC) Applications," 2007 Symposium on VLSI Technology Digest of Technical Papers.

Charles Kuo et al., "A Capacitorless Double Gate DRAM Technology for Sub-100-nm Embedded and Stand-Alone Memory Applications," IEEE Transactions on Electron Devices, vol. 50, No. 12, Dec. 2003, p. 2408.

* cited by examiner

*Primary Examiner* — Matthew Reames
(74) *Attorney, Agent, or Firm* — Cantor Colburn LLP

(57) ABSTRACT

Provided are a high-performance one-transistor floating-body DRAM cell device and a manufacturing method thereof. The one-transistor floating-body DRAM cell device includes: a semiconductor substrate; a gate stack which is formed on the semiconductor substrate; a control electrode which is formed on the semiconductor substrate and surrounded by the gate stack; a floating body which is formed on the control electrode that is surrounded by the gate stack; source/drain which are formed at left and right sides of the floating body; an insulating layer which insulates the source/drain from the semiconductor substrate and the control electrode; a gate insulating layer which is formed on the floating body and the source/drain; and a gate electrode which is formed on the gate insulating layer. In the cell device having a double-gate structure, charges can be stored in a non-volatile manner by the control electrodes, so that it is possible to improve a degree of integration of devices, a uniformity of characteristic, and a sensing margin.

34 Claims, 8 Drawing Sheets

(a)

(b)

(a)

(b)

(a)

(b)

(a)

(b)

(a)

(b)

HIGH PERFORMANCE ONE-TRANSISTOR DRAM CELL DEVICE AND MANUFACTURING METHOD THEREOF

CROSS-REFERENCE TO RELATED PATENT APPLICATION

This application claims the benefit of Korean Patent Application No. 10-2007-0086516, filed on Aug. 28, 2007, in the Korean Intellectual Property Office, the disclosure of which is incorporated herein in its entirety by reference.

BACKGROUND OF THE INVENTION

1. Field of the Invention

The present invention relates to a device structure of a semiconductor device, particularly, a MOS transistor and a manufacturing method thereof, and more particularly, a high-performance one-transistor floating-body DRAM cell device having a double-gate structure where the one gate is a gate of a general MOS device and the other is a control electrode having a non-volatile memory function, a manufacturing method thereof, and a cell array of the devices.

2. Description of the Related Art

An existing DRAM cell device is constructed with one MOS transistor and one cell capacitor. Recently, as a degree of integration in a DRAM is increasingly required, a size of a cell device needs to be reduced, and a size of a cell capacitor needs to be reduced. Such a miniaturization of the cell device and the cell capacitor in the MOS device requires very difficult manufacturing processes. Recently, MOS devices having a floating body have been as DRAM cell devices. In the devices, DRAM memory operations can be performed by storing or removing charges in the floating body. In this technology, since one MOS cell device is used, the DRAM can be implemented by using simple processes unlike the conventional DRAM. Such a DRAM cell device is referred to as a one-transistor floating-body DRAM cell device (hereinafter, simply referred to as a one-transistor DRAM cell device or a 1T-DRAM cell device). The one-transistor DRAM cell device can be adapted to an existing DRAM. In addition, the one-transistor DRAM cell device can be embedded in an existing logic circuit (for example, a micro-processor or a network-processor). In this case, the one-transistor DRAM cell device is called as an eDRAM cell device. The one-transistor DRAM cell device used in the eDRAM has a high memory capacity or a high operating speed, so that its applications are increased. The one-transistor DRAM cell device has a floating body. The adjacent floating bodies are electrically isolated from each other so as to be floated. Information is stored in the floating body. Therefore, unlike a conventional DRAM cell device, in the one-transistor DRAM cell device, no cell capacitor is required. As a result, a cell area can be reduced, and a degree of integration of the DRAM cell devices can be improved.

FIG. 1 shows a conventional one-transistor DRAM cell device which is implemented on an SOI (Silicon On Insulator) substrate. The SOI substrate is a single-crystalline silicon film where a substrate 1, a buried insulating layer 2, a source 8, a drain 9, and a floating body 3 are formed. The source 8 and the drain 9 are disposed at both sides of the floating body 3. A gate insulating layer 10 is formed on the silicon film, and a gate electrode 11 is disposed on the gate insulating layer.

Now, operations of the conventional one-transistor DRAM cell device shown in FIG. 1 will be described in brief. The description is made under the assumption that the DRAM cell device is an NMOS device. However, the same description can be adapted to a PMOS device. Firstly, a write-1 operation is described. A source 8 is grounded, a drain 9 that is a bit line and a gate electrode 11 that is a word line are applied with voltages so that impact ionization can be easily formed. As a result, holes are generated in the floating body in the vicinity of the drain region 9. Some of the holes are accumulated in the floating body 3, and others are flown to the source region 8 over an potential barrier. A threshold voltage of the device is changed according to a concentration of the holes accumulated in the floating body 3. As a result, a drain current in a given read operation is changed. According to the write-1 operation, excessive holes exist in the floating body 3, so that the threshold voltage of the device is lowered. As a result, the drain current is increased. Now, the read operation is described. A voltage equal to or higher than the threshold voltage is applied to the gate electrode 11, and a bit-line read voltage lower than that of the write-1 operation is applied to the drain. According to whether the holes in the floating body 3 are excessive or depleted by the erase operation, the drain current is varied. The information in the cell is identified according to the difference in the drain current.

Next, a write-0 operation is described. If the gate electrode 11 is applied with a suitable voltage and if the drain 9 is applied with a negative voltage, the holes in the floating body are flown into the drain 9. Therefore, the floating body 3 is in the hole-deficient state, so that the threshold voltage of the device is increased. The one-transistor DRAM cell device is disclosed in U.S. Pat. No. 7,239,549.

A method using GIDL (Gate Induced Drain Leakage) as another example of the write-1 operation is described. A voltage of 0V or a negative voltage is applied to the gate of the device, and a positive voltage is applied to the drain 9 connected to the bit line. Therefore, electron-hole pairs are generated due to band-to-band tunneling in a region where the drain and the gate are overlapped with each other. The electrons are flown into the drain 9, and the holes are stored in the floating body 3.

FIG. 1 shows a miniaturization of a gate length from a left structure to a right structure. Since the miniaturization of device leads to an increase in capacity of DRAM, it is very important. However, due to the miniaturization of channel length, a short channel effect occurs. In addition, a size of a floating body which stores information is reduced, so that a difference in drain current between the write-1 state and the write-0 state is decreased. Accordingly, it is difficult to sense and to store information for a long time.

In order to solve the problem, one-transistor DRAM cell devices having a double-gate structure that is effective in the miniaturization of device have been proposed. Now, three representative structures among the proposed double-gate structures are described. FIGS. 2(a) to (c) show the proposed double-gate structures. An upper gate electrode 11 and a substrate are used, or an additional electrode is inserted as a lower electrode. FIGS. 1(a) and (b) show the proposed one-transistor DRAM cell device. In FIG. 1(a), a lower electrode (not shown) is provided to be independent of the substrate 1. In FIG. 1(b), the substrate 1 has a function as a lower electrode. In the cell devices, by using a bias of the lower electrode, holes can be held in the floating body 3 for a long time, and a sensing margin can be improved. Hereinafter, the structures will be described in detail.

FIG. 2(a) shows an example of a conventional one-transistor DRAM cell device published in UC Berkeley (Charles Kuo et al, "A Capacitor-less Double Gate DRAM Technology for Sub-100-nm Embedded and Stand-Alone Memory Applications," IEEE Trans. on Electron Devices, vol. 50, no. 12, pp. 2408-2416, 2003). In the example, an upper gate 11 and a lower gate 25 are disposed on and under a floating body 3, respectively, so that the upper gate 11 and the lower gate 25 are electrically independent of each other. In the one-transistor DRAM cell device, due to the characteristics of the double-gate structure, it is possible to suppress the short channel effect and to improve the sensing margin. In the cell device, a negative voltage (for example, −1V) is applied to the lower gate 25, so that the holes can be held in the floating body 3 in the write-1 operation for a long time. In addition, during an erase operation, a voltage of 0V is applied to the lower gate 25, so that the holes in the floating body 3 can be effectively flown into a drain region. Accordingly, it is possible to improve the sensing margin. However, the one-transistor DRAM cell device has the problems as follows. Generally, in a case where the floating body 3 in the double-gate structure has a small thickness and is completed depleted, a width of the body needs to be small so as to suppress the short channel effect. A threshold voltage of the double-gate device having a completely-depleted body depends on the thickness of the body and a doping concentration of the body. Although a completely-depleted device is actually manufactured, a dispersion of the threshold voltages among the cell devices is too large, so that it is difficult to implement a practical device. In addition, the lower gate electrode 25 needs to be independently provided to each cell device, there is a problem in that a degree of integration of cell devices is greatly decreased in a layout of a cell array of the cell devices.

FIG. 2(b) shows another example of a conventional one-transistor DRAM cell device having a double-gate structure published by Samsung electronics (Chang Woo Oh et al, "Floating Body DRAM Characteristics of Silicon-On-ONO (SOONO) Devices for System-on-Chip (SoC) Applications" in VLSI Tech., Dig., 2007, pp. 168-169.). In the cell device, an existing bulk silicon substrate is used as a substitute for an SOI substrate, and an SiGe film is used as a sacrificial layer so as to implement a floating body 3. In FIG. 2(b), spaces filled with a fourth insulating layer 21 and a first nitride layer 22 are the regions where the SiGe film initially exists. A thickness of the insulating layers is about 50 nm. In the cell device, in order to obtain the double-gate effect, the substrate 1 is used like a lower electrode. Although the sensing margin can be improved due to the double-gate effect, the one-transistor DRAM cell device has the problems as follows. Firstly, since a thickness (about 50 nm in the example) of the insulating layer formed between the lower gate electrode 7 and the floating body 3 is too large, a high voltage of about −5V needs to be always applied so as to store holes in the body. The thickness of the insulating layer may be reduced by reducing a thickness of the sacrificial layer of the SiGe layer in the cell device manufacturing processes. However, if the thickness is reduced, much difficulty is involved with the processes. Secondly, since the substrate 1 is used as the lower gate electrode, the substrate is common to the all cell devices, so that it is impossible to apply a bias to a specific cell device or to cell device in a specific region. In addition, in order to independently provide the lower gate electrodes 7 to the cell devices, that is, in order to independently form the lower gate electrodes, wells may be formed in the substrate 1. However, in this case, since an interval between the wells needs to be enlarged, a degree of integration is greatly decreased. Thirdly, as described in FIG. 2(a), since a completely-depleted floating body needs to be used, there is an elementary problem in that a dispersion of read currents among the cell devices is increased.

FIG. 2(c) shows still another example a double-gate structure published in Cornell University (Arvind Kumar et al, "Scaling of Flash NVRAM to 10's of nm by Decoupling of Storage from Read/Sense Using Back-Floating Gates," IEEE Trans. on Nanotechnology, vol. 1, no. 4, pp. 247-254, December 2002). The double-gate structure is contrived for an exiting flash memory but a one-transistor DRAM cell device. According to the published document, write/erase operations are performed by storing or removing charges in a floating storage node through a bottom electrode 23, and a memory storage state is read by using an upper gate electrode 11. However, according to the published result, a change in threshold voltage in the write/erase operations in the device is not good. Although the structure is contrived for a flash device, the structure may be adapted to a one-transistor DRAM cell device. However, there is no published one-transistor DRAM cell device using the structure. If the structure is directly adapted to the one-transistor DRAM cell device, there are problems as follows. Firstly, since a thickness of an insulating layer interposed between a floating body 3 and a bottom electrode 23 having an effect of a lower electrode is too large, a very high voltage needs to be applied to the bottom electrode 23 so as to obtain the double-gate effect. If a thickness of insulating layers on and under a floating storage node 4 is reduced so as to reduce the voltage, the device cannot be operated as a suitable flash memory. In particular, since the floating storage node 24 in the published structure is a conductive layer, a thickens of a tunneling insulating layer disposed thereon needs to be at least about 7 nm so as not to lose information. Secondly, since the bottom electrodes 23 formed in the substrate 1 are not electrically isolated between the cell devices, a lower electrode effect for a specific cell device or for a plurality of cell devices in a specific region cannot be reduced. In the published document, in order to form the bottom electrode, a highly-doped substrate or a substrate of which upper portion is highly doped is used. That is, the bottom substrate 23 is formed by doping the substrate with impurities. In this case, since an interval between the bottom electrodes 23 of the cell devices needs to be enlarged so as to electrically independently provide the bottom electrodes 23 to the cell devices, there is a problem in that a degree of integration in a cell array of the cell device is greatly decreased. Thirdly, as described above with reference to FIGS. 2(a) and (b), since the dispersion of the threshold voltages among the cell devices having completely-depleted floating body 3 is too large, it is difficult to practically implement the one-transistor DRAM cell device without a special method.

SUMMARY OF THE INVENTION

The present invention provides a one-transistor DRAM cell device having a double-gate structure, wherein a gate electrode is a MOS-based gate electrode and a control electrode has a non-volatile memory function, so that it is possible to improve a degree of integration and a sensing margin between write-1 and write-0 operations and to reduce a dispersion of threshold voltages among the cell device by using the non-volatile memory function.

The present invention also provides cell arrays of the aforementioned one-transistor DRAM cell devices with various constructions in consideration of performances and a degree of integration of devices.

The present invention also provides a method of manufacturing the aforementioned one-transistor DRAM cell device.

According to an aspect of the present invention, there is provided a device structure where a gate electrode for an MOSFET operation and a control electrode for a non-volatile memory operation are formed at respective sides of a silicon film where a source region, a drain region, and a floating body are formed, a cell array of the devices, and a manufacturing method thereof.

According to another aspect of the present invention, there is provided a one-transistor floating-body DRAM cell device comprising: a semiconductor substrate; a gate stack which is formed on the semiconductor substrate; a control electrode which is formed on the semiconductor substrate and surrounded by the gate stack; a floating body which is formed on the control electrode that is surrounded by the gate stack; source/drain which are formed at left and right sides of the floating body; an insulating layer which insulates the source/drain from the semiconductor substrate and the control electrode; a gate insulating layer which is formed on the floating body and the source/drain; and a gate electrode which is formed on the gate insulating layer.

In the above aspect, the semiconductor substrate of which surface region is doped with a high concentration of $10^{17}$ cm$^{-3}$ or more or of which total concentration is increased up to $10^{17}$ cm$^{-3}$ or more may be used as a substrate electrode for improving a performance of the device. In addition, a well which is doped with a high concentration of $10^{17}$ cm$^{-3}$ or more is formed on the semiconductor substrate and the well may be used as a substrate electrode so as to control a specific cell device.

In addition, the gate stack may include a tunneling insulating layer and a charge storage node. In addition, the gate stack may further include a blocking insulating layer. In addition, the gate stack surrounding the control electrode may include a tunneling insulating layer, wherein the tunneling insulating layer is not formed between the insulating layer and the gate stack.

According to another aspect of the present invention, there is provided a cell array in which the aforementioned one-transistor floating-body DRAM cell devices as cell devices are disposed in an array, wherein the gate electrode and the control electrode of the one-transistor floating-body DRAM cell device are disposed to be in parallel to or in intersection with each other.

In the above aspect, sources of two cell devices which are formed on an isolated single-crystalline silicon film may be commonly connected to each other.

In addition, the control electrodes of the cell devices in the cell array may be electrically isolated from each other. In addition, the control electrodes of the cell devices which are arrayed in a row in the cell array may be electrically connected to each other. In addition, the control electrodes of the two or more cell devices which are arrayed in a row in the cell array may be electrically connected to each other. Accordingly, the control electrodes are constructed so as to be common to a plurality of the cell devices.

According to still another aspect of the present invention, there is provided a one-transistor floating-body DRAM cell device comprising: a semiconductor substrate; a source which is formed on the semiconductor substrate; a floating body which is formed on the source; a drain which is formed on the floating body; a gate insulating layer which is formed on a first side surface of a vertical structure constructed with the floating body, the source, and the drain; a gate stack which is formed on a second side surface of the vertical structure which is opposite to the first side surface of the vertical structure; a gate electrode which is formed on a second side surface of the gate insulating layer which is opposite to a first side surface of the gate insulating layer which is in contact with the vertical structure; a control electrode which is formed on the second side surface of the gate stack which is opposite to the first side surface of the gate stack which is in contact with the vertical structure, the control electrode being surrounded by the gate stack; and an insulating layer which is formed between the gate electrode and the semiconductor substrate and between the control electrode and the semiconductor substrate.

In the aforementioned cell device according to the present invention, the upper gate electrode in the double-gate structure is constructed with a gate which is generally used for an MOS device, and the lower control electrode is constructed so as to have a non-volatile memory function. Therefore, it is possible to obtain a good miniaturization characteristic of the cell device. In addition, it is possible to reduce a dispersion of the threshold voltages by adjusting an amount of charges in the charge storage node. In addition, it is possible to improve a degree of integration of the cell array by commonly using a suitable control electrode. In addition, it is possible to improve performances of the DRAM cell device by adding a memory function to write/erase/read operations.

BRIEF DESCRIPTION OF THE DRAWINGS

The above and other features and advantages of the present invention will become more apparent by describing in detail exemplary embodiments thereof with reference to the attached drawings in which:

FIG. 3(a) is a cross-sectional view showing a cell device where a charge storage node formed around a low control gate is constructed with multiple layers, and FIG. 3(b) is a cross-sectional view showing a cell device where a charge storage node is constructed with nano-sized dots;

FIG. 4(a) is a cross-sectional view showing a cell device where a lower control electrode is disposed at a source side, and FIG. 4(b) is a cross-sectional view showing a cell device where the lower control electrode is disposed at a drain side;

FIG. 6(a) is a layout showing a cell array of the one-transistor DRAM cell devices using an existing single-gate structure, and FIG. 6(b) is a layout showing a cell array of the one-transistor DRAM cell devices according to the present invention, wherein lower control electrodes of cell devices are independently controlled;

FIG. 7(a) is a layout showing a cell array where lower control electrodes are disposed in a direction of intersecting upper gate electrodes and the lower control electrodes of the cell devices which are disposed in a longitudinal direction of a channel region are commonly used, and FIG. 7(b) is a layout showing a cell array where lower control electrodes are disposed in parallel to a direction of upper gate electrodes and the lower control electrodes of the cell devices which are disposed in intersection with the upper gate electrodes are connected to each other;

FIG. 8(a) is a layout showing a cell array where lower control electrodes are disposed in a manner similar to FIG. 6(b) and widths of the lower control electrodes disposed in a direction of the upper gate electrodes is substantially equal to that of the upper gate electrode, wherein all the lower control electrodes of the cell devices connected with a common source are connected to each other, and FIG. 8(b) is a layout showing a cell array where the lower control electrodes of the cell devices connected with the common source are isolated from each other;

DETAILED DESCRIPTION OF THE INVENTION

Figure 1:
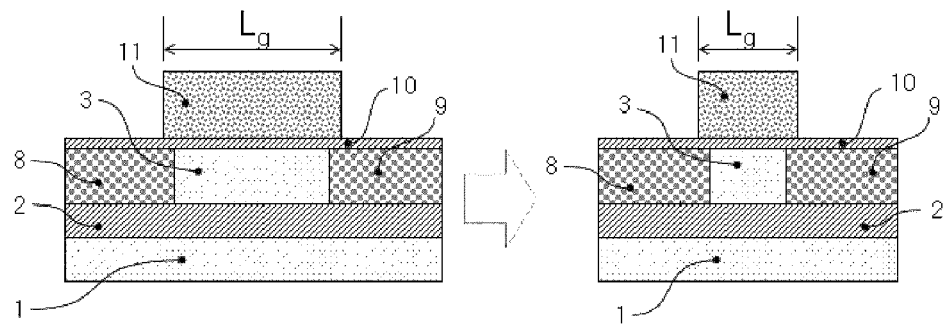
FIG. 1 shows a conventional one-transistor DRAM cell device which is implemented on an SOI substrate, wherein two cross-section views shows miniaturization of a gate length.
Figure 2:
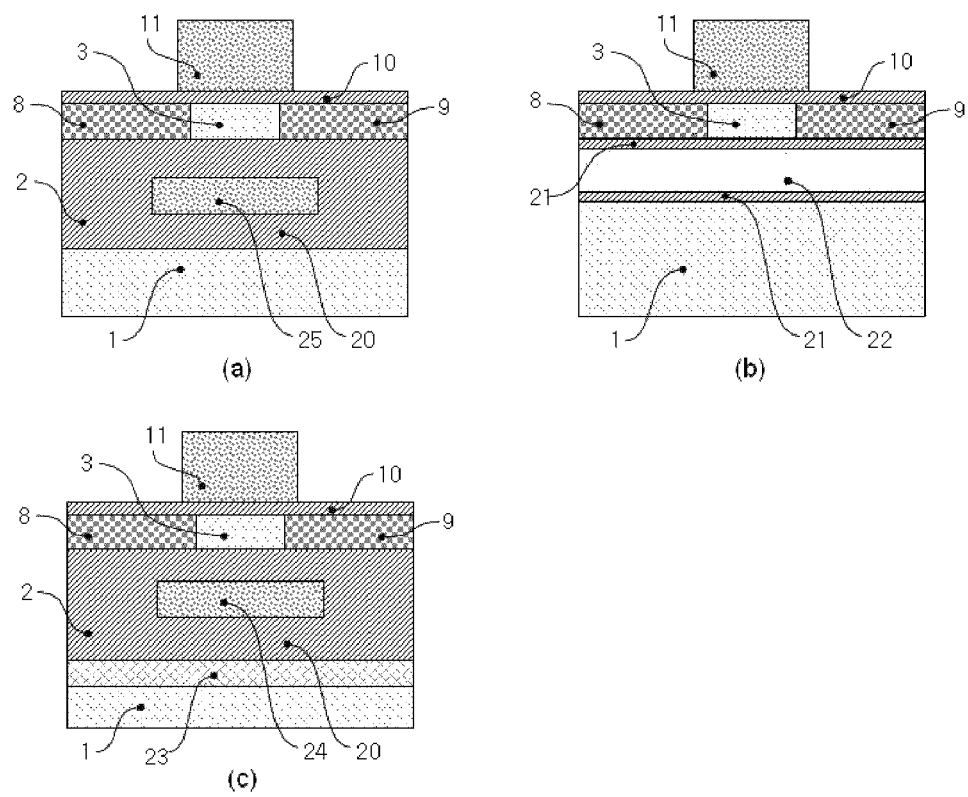
FIGS. 2(a) and (b) are cross-sectional views showing conventional one-transistor DRAM cell devices having a double-gate structure.
FIG. 2(c) is a cross-sectional view showing another example of the conventional one-transistor DRAM cell device having a double-gate structure where a substrate is sued as a low electrode.

Hereinafter, exemplary embodiments of the present invention will be described with reference to the accompanying drawings. The embodiments are provided to the skilled person in the related art for the better understanding of principles of the present invention. Therefore, the present invention is not limited to the embodiments, but various modifications can be implemented. In the description of the present invention, an NMOS device cell is assumed if there is no specific mention. All the description and principles can be adapted to a PMOS cell.

One-Transistor DRAM Cell Device

A structure of a one-transistor DRAM cell device according to a first embodiment of the present invention will be described with reference to FIG. 3. FIG. 3(a) is a cross-sectional view showing the structure of the one-transistor DRAM cell device according to the first embodiment. In the structure, a source 8, a drain 9, and a floating body 3 are formed in a silicon film, and a gate electrode 11 and a control electrode 7 are formed on upper and lower portion of the silicon film, which is called a double-gate structure having a good miniaturization characteristic. Since the gate electrode 11 is disposed on the upper portion and the control electrode 7 is disposed on the lower portion, the gate electrode and the control electrode are sometimes referred as an upper gate electrode and a lower control electrode, respectively.

In FIG. 3(a), the lower control electrode 7 is surrounded by a so-called gate stack. The gate stack is constructed with a tunneling insulating layer 4, a charge storage node 5, and a blocking insulating layer 6. As an alternative construction (not shown), the gate stack may be constructed with a tunneling insulating layer 4 and a dielectric charge storage node. In case of using an SOI (Silicon On Insulator) wafer, buried insulating layers 2 are disposed at left and right sides of the gate stack. Under the assumption that the tunneling insulating layer 4 is not formed in the buried insulating layer in a thermal oxidation method, the buried insulating layer is not shown in FIG. 3(a). If a CVD (Chemical Vapor Deposition) method, an ALD (Atomic Layer Deposition) method or the like except for the thermal oxidation method is used, the tunneling insulating layer 4 can be formed in the buried insulating layer. The tunneling insulating layer 4 may be constructed with a single layer or with two or more of insulating layers having different work functions or band gaps. The charge storage node 5 may be constructed with a conductive layer or an insulating layer. As shown in FIG. 3(b), the charge storage node 5 may be constructed with conductive or dielectric nano-sized dots 12. The blocking insulating layer may be constructed with a single layer or with two or more of insulating layers having different work functions or band gaps.

The control electrode 7 may be constructed with one or more of materials having various work functions such as a conductive semiconductor, a metal, a metal oxide, a silicide, a two-element metal, and a metal nitride (for example, TaN, TiN, WN, or the like). The control electrode 7 can have a function of a control electrode of an exiting non-volatile memory device. That is, the control electrode 7 can perform write and erase operations on the charge storage node 5 according to a bias conduction of the control electrode 7. In case of a completely-depleted floating body, if charges are stored in the charge storage node 5 through the control electrode 7, performances of the device can be greatly improved.

A surface region of the semiconductor substrate 1 is doped with a high concentration, or a total concentration of the semiconductor substrate 1 is increased, so that the semiconductor substrate 1 can be used as a substrate electrode for improving performances of the device. The substrate electrode may be connected through a contact to an external metal interconnection line. The write and erase operations on the charge storage node 5 can be performed through the substrate electrode, so that additional performances can be improved. Particularly, the write and erase operations can be performed by adjusting voltages of the substrate electrode and the lower control electrode.

Figure 4:
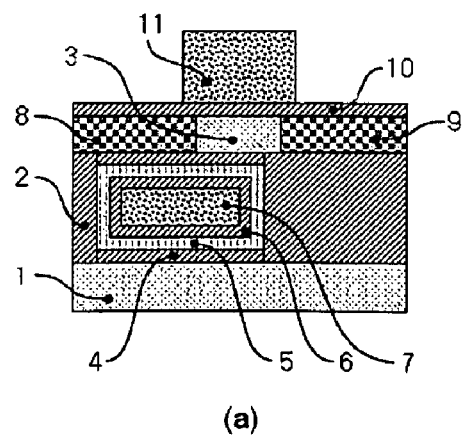
FIG. 4 shows cross-sectional views of one-transistor DRAM cell devices according to a second embodiment of the present invention.
Figure 4:
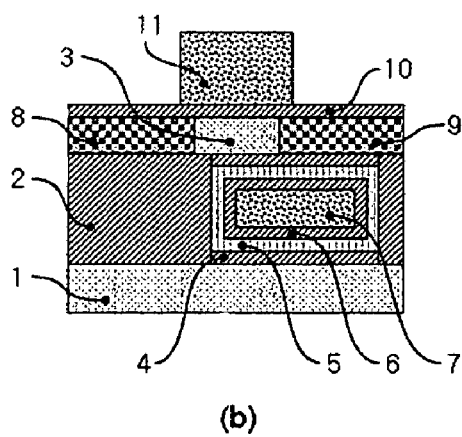

Preferably, the control electrode 7 is formed so as to be overlapped with the floating body 3 and with portions of the source region 8 and the drain region 9. In this case, due to the control electrode 7, the charges stored in the charge storage node 5 have a function of effectively holding holes (in case of an NMOS device) generated in the floating body 3 in the body region, so that sensing margin can be increased. Alternatively, a structure of a one-transistor DRAM cell device according to a second embodiment of the present invention is shown in FIG. 4. Referring to cross-sectional views shown in FIGS. 4(a) and (b), the control electrode 7 and the gate stack surrounding the control electrode 7 are formed so as to be overlapped with the floating body 3 and with a portion of the source region 8 or to be overlapped with the floating body 3 and with a portion of the drain region 9. In addition, the control electrode 7 and the gate stack surrounding the control electrode 7 may be formed so as to be slightly shifted toward the source region 8 or the drain region 9.

A length of the control electrode 7 is designed to be larger than that of the gate electrode 11. The gate electrode 11 may be constructed with one or more of materials such as a conductive semiconductor, a metal, a metal oxide, a silicide, a two-element a metal, and a metal nitride (for example, TaN, TiN, W, or the like). The gate electrode 7 may be constructed with conductive materials having various work functions. The work function of the control electrode 7 may be designed to be higher than that of the gate electrode 11. As an example, a one-transistor DRAM cell device having the gate electrode 11 constructed with an n+ polysilicon and the control electrode 7 constructed with a p+ polysilicon is described in brief. A high threshold voltage can be maintained by the n+ polysilicon gate, so that an write operation current can be ensured at a low voltage. Particularly, the p+ polysilicon control electrode has an advantage of collecting holes (in case of an NMOS device) in the floating body 3. In addition, in a case where the electrons are stored in the charge storage node 5 through the control electrode 7, due to the high work function of the control electrode 7, a holding time and a sensing margin can be greatly improved.

Figure 3:
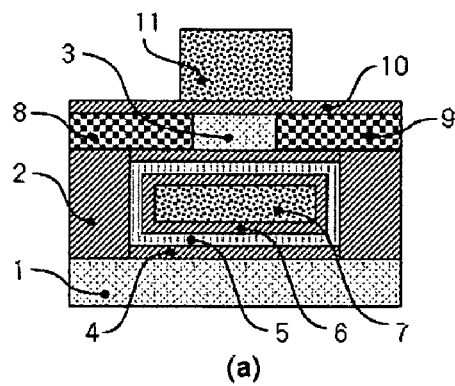
FIG. 3 shows cross-sectional views of one-transistor DRAM cell devices according to a first embodiment of the present invention.
Figure 3:
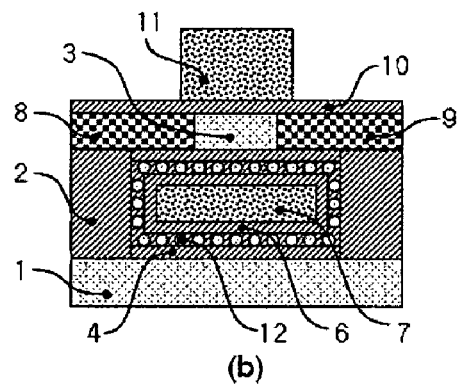

In the structure according to the embodiment of the present invention shown in FIG. 3, a bit line which is electrically connected to the drain region 9 may be further included, and a word line which is electrically connected to the gate electrode 11 may be further included.

Figure 5:
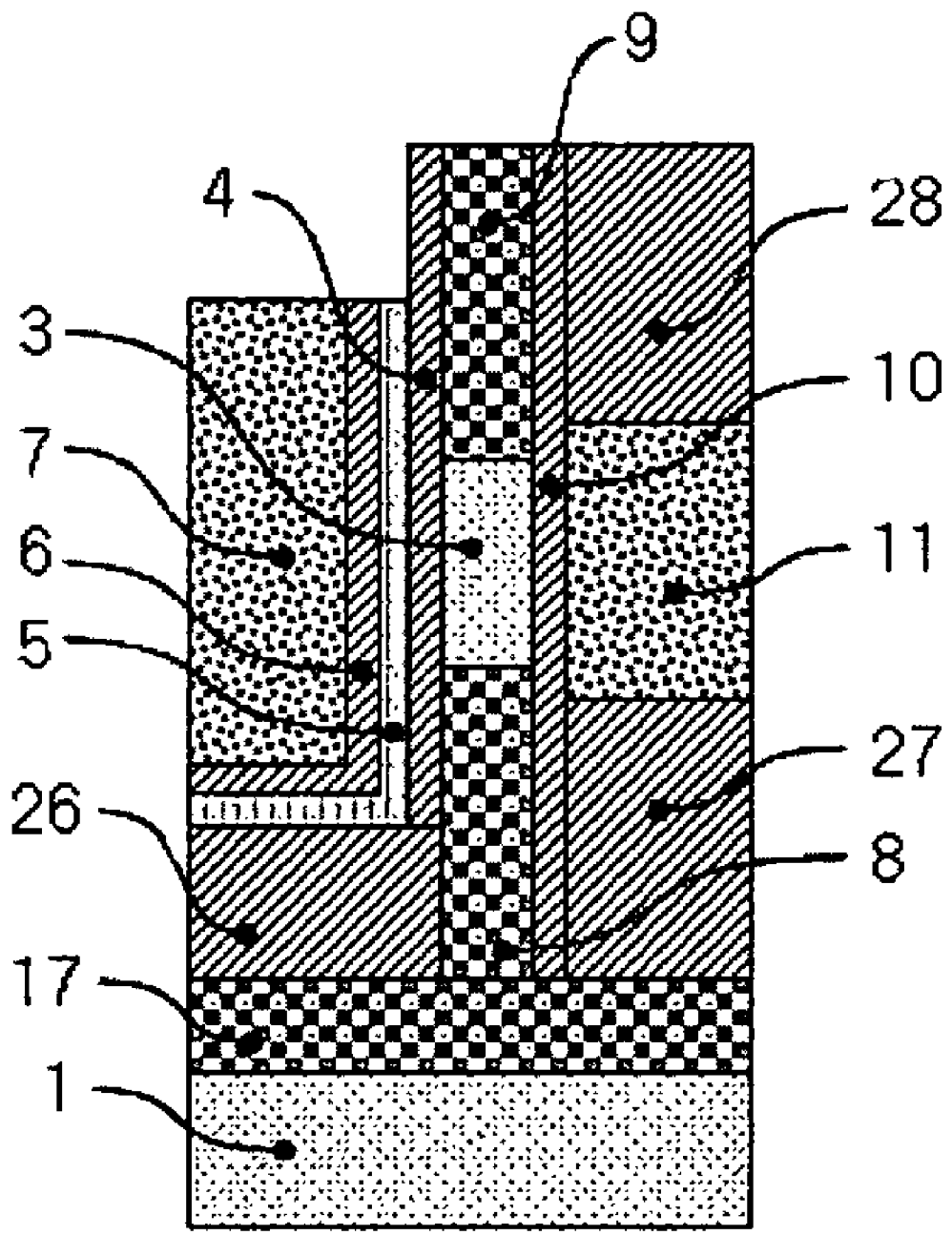
FIG. 5 is a cross-sectional view showing a one-transistor DRAM cell device having a vertical structure according to a third embodiment of the present invention.

Hereinafter, a structure of a one-transistor DRAM cell device according to a third embodiment of the present invention will be described with reference to FIG. 5. Referring to FIG. 5, basic constructions of the structure according to the first embodiment shown in FIG. 3(*a*) are adapted to the third embodiment except that the source region 8, the drain region 9, and the floating body 3 are formed in a vertical structure. The drain region 9 is formed on the floating body 3, and the source region 8 is formed under the floating body 3. The source region 8 formed in the lower portion of the vertical structure is connected to a source interconnection-line region 17 which is horizontally formed in an upper portion of the semiconductor substrate 1. The horizontally-formed source interconnection-line region 17 has a function of a low-resistance interconnection line. In a case where a plurality of the vertical one-transistor DRAM cell devices are disposed in an array, the horizontally-formed source interconnection-line regions 17 are commonly connected to each other, so that a degree of integration of the devices can be increased. The horizontally-formed source interconnection-line regions 17 may be disposed in a direction which is in parallel to or in intersection with a direction where the gate electrodes 11 are disposed. The source interconnection-line regions 17 may be isolated from each other or commonly connected to each other. In the one side of the vertical silicon structure, the gate electrode 11 is connected to the floating body 3 through a gate insulating layer 10. In the other side of the vertical silicon structure, the gate stack and the control electrode 7 are formed so as to provide a non-volatile memory function. A fifth insulating layer 26 and a sixth insulating layer 27 for electrical insulation of the substrate 1 and the source interconnection-line region 17 are formed under the gate electrode 11 and the control electrode 7, respectively. In addition, a seventh insulating layer 28 is formed on the gate electrode 11, so that a metal interconnection line which may be formed above the gate electrode can be electrically isolated from the gate electrode. Although not shown, an insulating layer may be formed on the control electrode 7, if needed. In the vertical one-transistor DRAM cell device, the gate stack is constructed with a tunneling insulating layer 4, a charge storage node 5, and a blocking insulating layer 6. Although not shown in the figure, the gate stack may be constructed with only the tunneling insulating layer 4 and the dielectric charge storage node 5. Various modifications of the gate stack, the tunneling insulating layer 4, the charge storage node 5, the blocking insulating layer 6, the gate electrode 11, and the control electrode 7 which are described with reference to FIG. 3 can be adapted to the embodiment. In addition, in the structure, a bite line is connected to the drain 9, and a word line is connected to the gate electrode 11.

Cell Array of One-Transistor DRAM Cell Devices

Hereinafter, main regions of a cell array of the one-transistor floating-body DRAM cell devices according to the aforementioned embodiments of the present invention will be descried in detail with reference to FIGS. 6 to 8. Although the same contact region 14 is shown to be formed in the source region 8, the drain region 9, and the control electrode 7, individual contact regions may be formed according to types of processes if needed. This concept can be adapted to the gate electrode 11.

Figure 6:
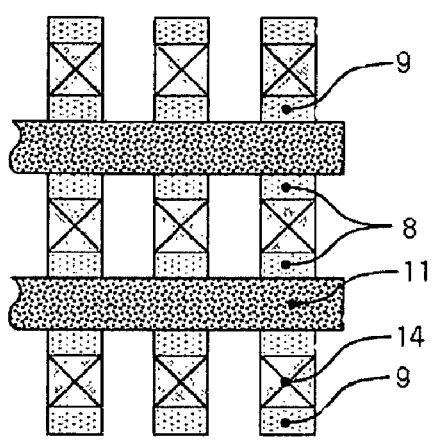
FIG. 6 shows layouts of main regions in cell arrays of one-transistor DRAM cell devices.
Figure 6:
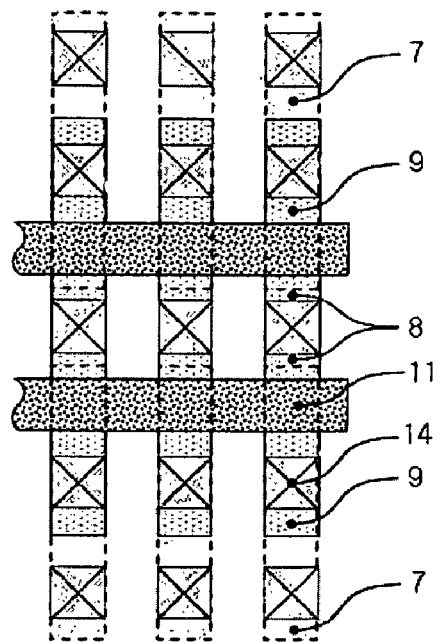

Firstly, FIG. 6(*a*) is a layout showing a cell array of the existing one-transistor DRAM cell devices having a single gate. In the two cell devices, the source region 8 is commonly used, so that an effective area of one cell can be reduced. Contacts formed in the source regions 8 are electrically commonly connected. The drain regions 9 of the cell devices having the same gate electrode 11 are electrically isolated from each and connected to the bit line.

Next, FIG. 6(*b*) is a layout showing a cell array of the one-transistor DRAM cell devices according to the present invention, wherein the control electrodes 7 of the cell devices are electrically independently provided. In this case, performances of the devices can be greatly improved, but a degree of integration is decreased in comparison with the existing cell array. Due the layout shown in FIG. 6(*b*), the control electrode of each cell device can be used like a back gate in a double-gate structure in write 1, write 9, erase, and read operations, so that a holding time and sensing margin can be greatly improved. In addition, current information stored in the floating body 3 can be stored in the lower gate stack having a non-volatile memory function by using the control electrode 7 if needed, so that disadvantage of non-volatile memory function of the existing DRAM can be compensated. In addition, the number of charges stored in the gate stack having the non-volatile memory function is adjusted by using the control electrode 7 which are independently provided to the cell devices, so that a dispersion of threshold voltages among the cell device which occurs in the read operation of each cell device can be reduced. Such a function is an initial operation conduction in the one-transistor DRAM cell device, which has not been disclosed before.

Figure 7:
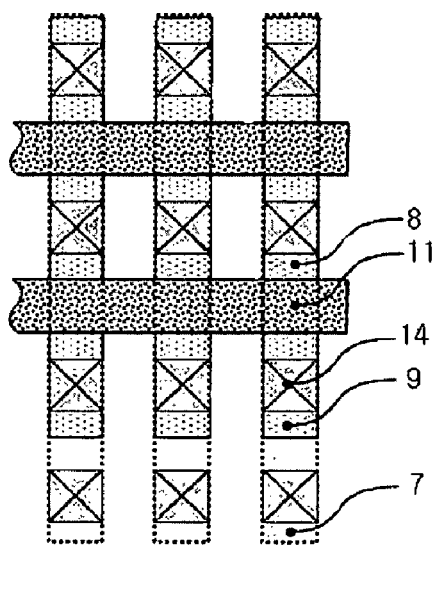
FIG. 7 shows layouts of main regions in cell arrays of one-transistor DRAM cell devices according to the present invention.
Figure 7:
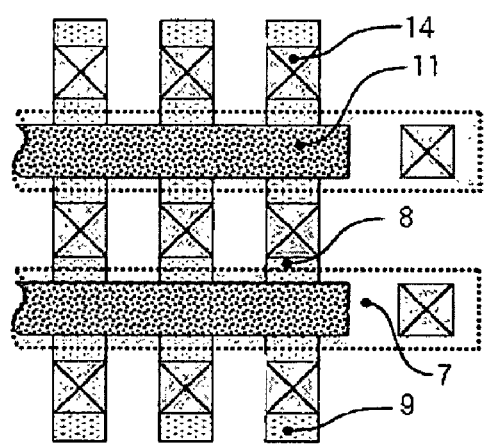
Figure 8:
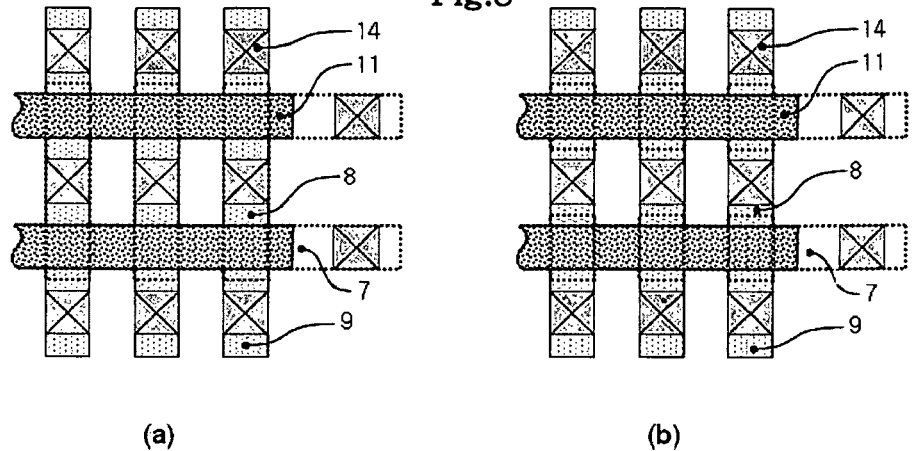
FIG. 8 shows layouts of main regions in cell arrays of one-transistor DRAM cell devices according to the present invention.

In the cell arrays shown in FIG. 6(*b*) and FIGS. 7 and 8, the gate electrode 11 and the control electrode 7 may be disposed in parallel to or in intersection with each other. In such a construction, a degree of integration or a performance of the devices can be improved. As described above, the source regions of the cell devices formed in the isolated silicon films 15 may be commonly connected. The sources are electrically connected to the common source 8 formed on the isolated silicon films 15, so that a degree of integration can be improved. In the figures, for the convenience of description of the present invention, a width of the control electrode 7 is shown to be the same as or larger than that of the gate electrode 11, but the widths may be charged if needed.

Referring to FIG. 7(*a*), the control electrode 7 is disposed in a direction of intersecting the gate electrode 11, and a contact for electrical connection to a metal interconnection line is formed in a longitudinal direction of the isolated single-crystalline silicon film 15. In each of the isolated single-crystalline silicon films 15, two cell devices are arrayed in a row. Therefore, in FIG. 7(*a*), the control electrodes 7 of the two cell devices commonly connected. As the cells shown in FIG. 7(*b*) are repetitively arrayed, the control electrodes 7 are repetitively formed in the longitudinal direction of the isolated single-crystalline silicon films 15. The control electrodes 7 of four cell devices can be commonly connected through the contacts of the control electrodes between two isolated single-crystalline silicon films 15 which are arrayed in intersection with the gate electrodes 11. The control electrodes 7 of the two or four cell devices which are arrayed in intersection with the gate electrodes 11 are connected in a single module as described above. In addition, the control electrodes 7 of two or more of the modules can be connected to each other. In this manner, if the control electrodes are connected in a module type rather than in unit of a cell device, a marginal range of a bias voltage applied to the control electrode 7 may be decreased, but the degree of integration and the performances of the device can be improved. Since a change in device characteristics (for example, a threshold voltage) between adjacent cell devices are not large, the common connection of the control electrodes leads to an effective write operation in terms of a decrease in a dispersion of threshold voltages among the cell devices.

In the cell array shown in FIG. 7(b), the control electrodes 7 of the cell devices are disposed in parallel to the gate electrodes 11. The control electrodes 7 of the two cell devices of the isolated single-crystalline silicon films 15 which are disposed in intersection with the gate electrodes 11 are formed to be electrically isolated from each other. The control electrodes 7 of the cell devices which are formed in intersection with the independent gate electrodes 11 may be connected to each other in the direction of the gate electrode 11. In the cell array, a plurality of the independent gate electrodes 11 are formed. Therefore, there are control electrodes 7 which are connected along a plurality of the gate electrode 11. The cell array can be constructed by connecting two or more of the control electrodes 7.

FIG. 8 shows other types of the cell arrays according to the present invention. The control electrodes 7 of the two cell devices formed in the isolated single-crystalline silicon bodies 15 which are disposed in intersection with the gate electrodes 11 are connected to each other, and the control electrodes 7 formed in the isolated single-crystalline silicon bodies 15 which are disposed along the gate electrodes 11 are connected to each other. The cell array shown in FIG. 8(b) is the same as that shown in FIG. 8(b) except that the control electrodes 7 of the two cell devices formed in the isolated single-crystalline silicon bodies 15 are isolated from each other. In the various cell arrays, the control electrodes of the cell devices are independently formed, or the control electrodes of a plurality of the cell devices are commonly connected, so that the performances of the cell devices, the degree of integration, or both thereof can be improved.

In a cell array according to another embodiment of the present invention, the aforementioned one-transistor floating-body DRAM cell devices may disposed in an array, and the gate electrodes and the control electrodes may be disposed in parallel to or in intersection with each other.

In a cell array according to another embodiment of the present invention, the aforementioned one-transistor floating-body DRAM cell devices may disposed in an array, and the source regions of the two cell devices formed in the isolated single-crystalline silicon films may be commonly connected.

In a cell array according to another embodiment of the present invention, the aforementioned one-transistor floating-body DRAM cell devices may disposed in an array, and the control electrodes of the cell devices may be electrically isolated from each other.

In a cell array according to another embodiment of the present invention, the aforementioned one-transistor floating-body DRAM cell devices may disposed in an array, and the control electrodes of the cell devices which are arrayed in a row in a direction of intersecting the gate electrodes may be electrically connected.

In a cell array according to another embodiment of the present invention, the aforementioned one-transistor floating-body DRAM cell devices may disposed in an array, and the control electrodes of the cell devices which are arrayed in a row in the direction of intersecting the gate electrodes are electrically connected, wherein the control electrodes of the two or more cell devices which are arrayed in a row are electrically connected.

In a cell array according to another embodiment of the present invention, the aforementioned one-transistor floating-body DRAM cell devices may disposed in an array, and the control electrodes of the cell devices which are arrayed in a row in a direction which is in parallel to the gate electrode may be electrically connected.

In a cell array according to another embodiment of the present invention, the aforementioned one-transistor floating-body DRAM cell devices may disposed in an array, and the control electrodes of the cell devices which are arrayed in a row in a direction which is in parallel to the gate electrode may be electrically connected, wherein the control electrodes of the two or more cell devices which are arrayed in a row may be electrically connected.

Method of Manufacturing One-Transistor DRAM Cell Device

Figure 9:
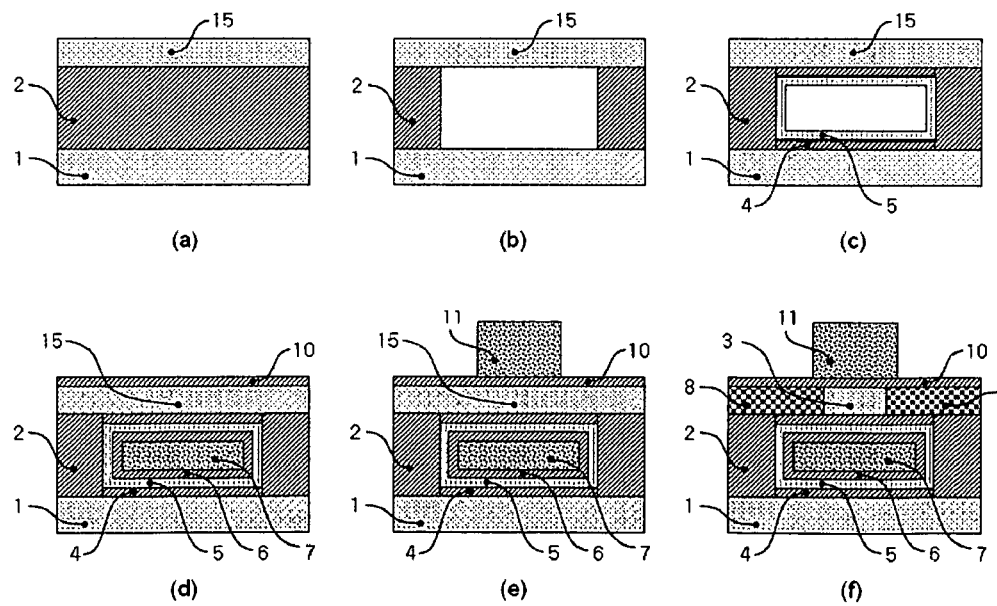
FIG. 9 shows sequential cross-sectional views of main processes of a method of manufacturing a one-transistor DRAM cell device by using an SOI (Silicon On Insulator) wafer according to an embodiment of the present invention.
Figure 10:
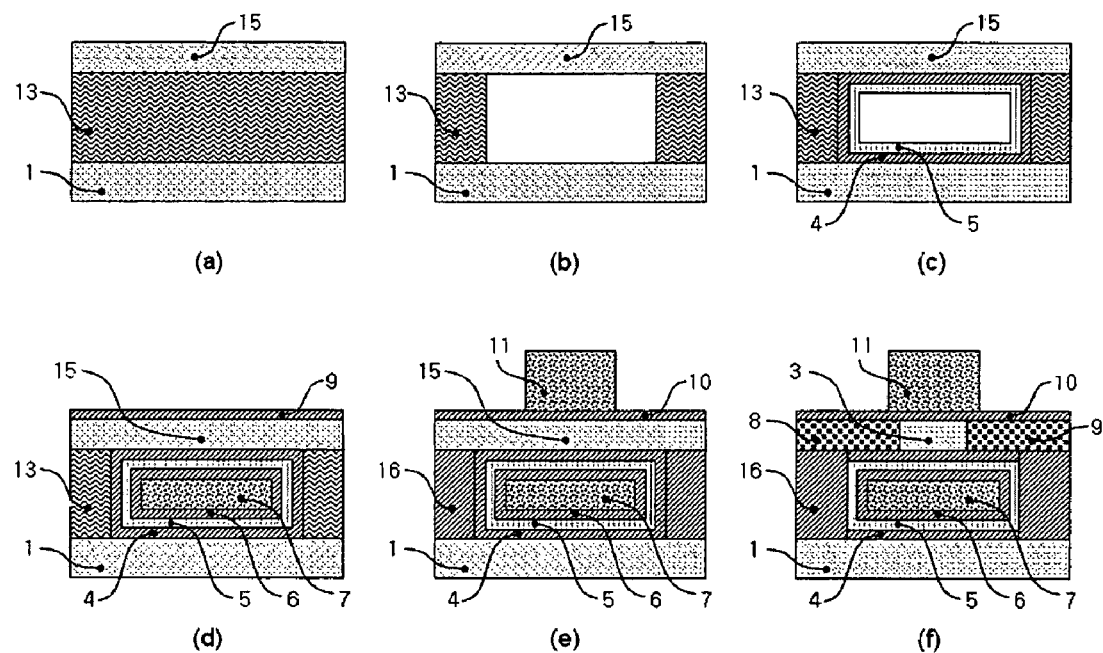
FIG. 10 shows sequential cross-sectional views of main processes of a method of manufacturing a one-transistor DRAM cell device by using a bulk silicon wafer substrate according to another embodiment of the present invention.

Hereinafter, a method of manufacturing the one-transistor DRAM cell device according to the present invention will be described. FIGS. 9 and 10 are cross-sectional views showing main processes of the method of manufacturing the cell device according to the present invention.

FIG. 9 shows an example of a manufacturing method using an SOI (Silicon On Insulator) wafer.

As shown in FIG. 9(a), firstly, a single-crystalline silicon film region 15 where a source region 8, a drain region 9, and a floating body 3 are to be formed is defined. As shown in FIG. 9(b), by using a mask, only the regions of a buried insulating layer 2 under the single-crystalline silicon film 15 where the floating body 3 and portions of the source region 8 and the drain regions 9 are to be formed are selectively removed, so that an under-cut is formed. Next, as shown in FIG. 9(c), a tunneling insulating layer 4 and a charge storage node 5 are formed. As shown in FIG. 9(d) a blocking insulating layer 6 and a control electrode 7 are formed. As shown in FIG. 9(e), a gate insulating layer 10 and a gate electrode 11 are sequentially formed. As shown in FIG. 9(f), the source region 8 and the drain region 9 are formed, and after that, post processes (contact and metal interconnection line forming processes) are performed.

FIG. 10 shows an example of a manufacturing method using a bulk silicon wafer.

As shown in FIG. 10(a), firstly, a single-crystalline SiGe film 13 and an Si film 15 are formed in the bulk silicon wafer 1, and a silicon film region 15 wherein the source region 8, the drain region 9, and the floating body 3 are to be formed is defined. As shown in FIG. 10(b), by using a mask, only the regions of the SiGe film 13 under the single-crystalline silicon film 15 where the floating body 3 and portions of the source region 8 and the drain regions 9 are to be formed are selectively removed, so that an under-cut is formed. Next, as shown in FIG. 10(c), a tunneling insulating layer 4 and a charge storage node 5 are formed. Next, as shown in FIG. 10(d), a blocking insulating layer 6 and a control electrode 7 are formed. Next, as shown in FIG. 10(e), the remained portion of the SiGe film 13 is removed, and a second insulating layer 16 is formed so that the source region 8 and the drain region 9 can be insulated from the substrate 1. Next, as shown in FIG. 10(e), a gate insulating layer 10 and a gate electrode 11 are sequentially formed. The source region 8 and the drain region 9 are formed, and after that, post processes (contact and metal interconnection line forming processes) are performed.

Another embodiment of a method of manufacturing the cell device according to the present invention by using a wafer where the single-crystalline SiGe film and the single-crystalline Si film are grown in the bulk silicon substrate will be described. A silicon film region where the source region, the drain region, and the floating body are to be formed is defined. Next, by using a mask, regions of the SiGe film under the single-crystalline silicon films are selectively removed, so that the region of the SiGe film under the region where the floating body and the portions of the source region and the drain regions are to be formed is remained. A second insulating layer is formed in the removed region of the SiGe film, and the remained regions of the SiGe film are selectively removed, so that an under-cut is formed. Next, a tunneling insulating layer and a charge storage node are formed. Next, a blocking insulating layer and a control electrode are formed. A gate insulating layer and a gate electrode are sequentially formed, and after that, post processes (contact and metal interconnections line forming processes) are performed.

In the aforementioned manufacturing method, the process of forming the control electrode 7 may include a process of forming a material for the control electrode 7 and a process of performing a planarizing process by using CMP (Chemical Mechanical Polishing). The control electrodes 7 corresponding to required portions are remained, and insulating layers are selectively formed on the exposed control electrodes 7 so that a non-volatile memory operation can be ensured.

Figure 11:
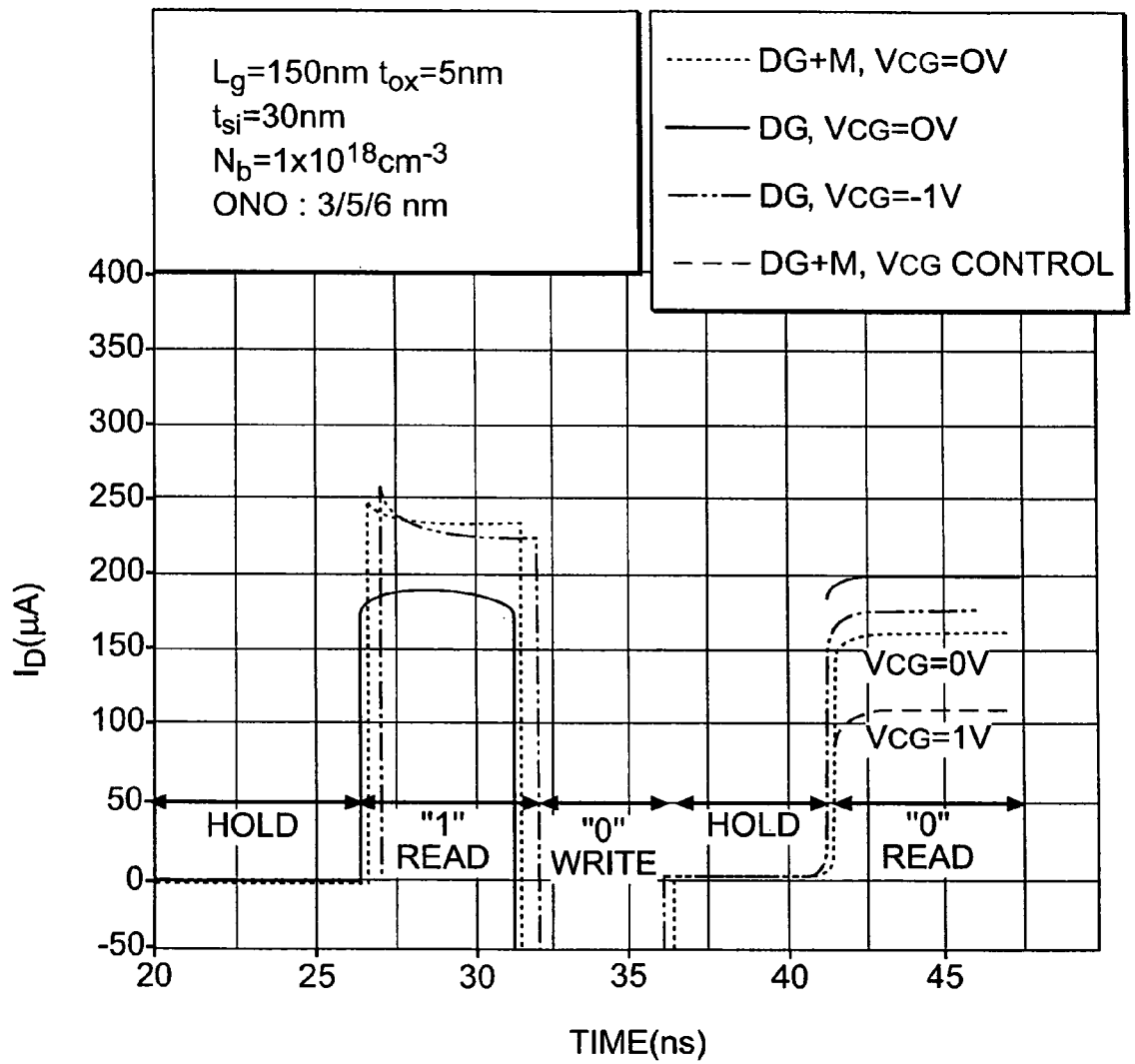
FIG. 11 is a graph showing transient characteristics of a cell device according to an embodiment of the present invention.

FIG. 11 is a graph showing transient characteristics of the device according to various operating voltage conditions in the double-gate structure in order to show one of effects of the present invention. In FIG. 11, "DG" denotes only the operations of the conventional double-gate structure, and "DG+M" denotes operations in the double-gate structure according to the present invention where the electrons are stored in the charge storage node 5 and the non-volatile memory function can be ensured. A doted line shows a result of a double-gate structure having a completely-depleted floating body. It can be understood that there is substantially no difference in current between write-0 and write-1 operations. Therefore, there is substantially no sensing margin. In the double-gate structure, during the write-1 and write-0 operations, if a voltage of $-1$ V is applied of the control electrode 7, the sensing margin is improved as shown in a dashed line. In this case, since the voltage of $-1$ V needs to be continuously applied to the control electrode 7, power consumption is increased. In a case where a non-volatile memory function is added to the double-gate structure and a voltage of the control electrode 7 is fixed, the sensing margin is similar to the sensing margin of the case where only the voltage of the control electrode 7 is controlled in the double-gate structure. In this case, since there is no need to electrically isolate the control electrodes 7 of all the cell devices, the degree of integration can be effectively increased. In addition to the result of the "DG+M" where the non-volatile memory function is added to the double-gate structure, the voltage of the control electrode is adjusted in each operation region, the sensing margin are further improved. According to the present invention, in the cell array of the one-transistor floating-body DRAM cell devices, the degree of integration and the characteristics of the devices can be improved by using the non-volatile memory function.

A cell device technology according to the present invention relates to a DRAM device using a cell capacitor and an operating method thereof. According to the cell device technology, it is possible to implement a highly-integrated, high-performance DRAM cell device. Therefore, the cell device and the manufacturing method thereof according to the present invention can be widely used for fields of manufacturing semiconductor devices such as MOS-based DRAM cell devices.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A one-transistor floating-body DRAM cell device comprising:
   a semiconductor substrate;
   a gate stack which is formed on the semiconductor substrate and includes at least a charge storage node;
   a control electrode which is formed on the semiconductor substrate and surrounded by the gate stack, the charge storage node surrounding the control electrode;
   a floating body which is formed on the gate stack surrounding the control electrode;
   source/drain which are formed at left and right sides of the floating body;
   an insulating layer which insulates the source/drain from the semiconductor substrate and the gate stack surrounding the control electrode;
   a gate insulating layer which is formed on the floating body and the source/drain; and
   a gate electrode which is formed on the gate insulating layer.

2. The one-transistor floating-body DRAM cell device of claim 1, wherein the semiconductor substrate of which surface region is doped with a high concentration of $10^{17} cm^{-3}$ or more or of which total concentration is increased up to $10^{17}$ $cm^{-3}$ or more is used as a substrate electrode.

3. The one-transistor floating-body DRAM cell device of claim 1, wherein a well which is doped with a high concentration of $10^{17}$ $cm^{-3}$ or more is formed on the semiconductor substrate and the well is used as a substrate electrode so as to control a specific cell device.

4. The one-transistor floating-body DRAM cell device of claim 1,
   wherein the gate stack surrounding the control electrode includes a tunneling insulating layer, and
   wherein the tunneling insulating layer is not formed between the insulating layer and the gate stack.

5. The one-transistor floating-body DRAM cell device of claim 1, wherein the gate stack further includes a tunneling insulating layer.

6. The one-transistor floating-body DRAM cell device of claim 1, wherein the gate stack further includes a blocking insulating layer.

7. The one-transistor floating-body DRAM cell device of claim 1, wherein the charge storage node is formed as a thin film or nano-sized dots.

8. The one-transistor floating-body DRAM cell device of claim 5, wherein the tunneling insulating layer is constructed with a single layer or with two or more of insulating layers having different work functions or band gaps.

9. The one-transistor floating-body DRAM cell device of claim 6, wherein the blocking insulating layer is constructed with a single layer or with two or more of insulating layers having different work functions or band gaps.

10. The one-transistor floating-body DRAM cell device of claim 1, wherein the control electrode is constructed with one or more of a conductive semiconductor, a metal, a metal oxide, a silicide, a two-element metal, and a metal nitride.

11. The one-transistor floating-body DRAM cell device of claim 1, wherein the control electrode is formed so as to be overlapped with portions of the source region and the drain region and with the floating body.

12. The one-transistor floating-body DRAM cell device of claim 1, wherein the control electrode is formed so as to be overlapped with the source region and the floating body or with the drain region and the floating body.

13. The one-transistor floating-body DRAM cell device of claim 1, wherein the gate electrode is constructed with one or more of a conductive semiconductor, a metal, a metal oxide, a silicide, a two-element metal, and a metal nitride.

14. The one-transistor floating-body DRAM cell device of claim 1, further comprising a word line which is electrically connected to the gate electrode.

15. The one-transistor floating-body DRAM cell device of claim 1, further comprising a bit line which is electrically connected to the drain region.

16. A cell array in which one-transistor floating-body DRAM cell devices as cell devices are disposed in array,
wherein each of the one-transistor floating-body DRAM cell device comprises:
a semiconductor substrate;
a gate stack which is formed on the semiconductor substrate and includes at least a charge storage node;
a control electrode which is formed on the semiconductor substrate and surrounded by the gate stack, the charge storage node surrounding the control electrode;
a floating body which is formed on gate stack surrounding the control electrode;
source/drain which are formed at left and right sides of the floating body;
an insulating layer which insulates the source/drain from the semiconductor substrate and the gate stack surrounding the control electrode;
a gate insulating layer which is formed on the floating body and the source/drain; and
a gate electrode which is formed on the gate insulating layer,
wherein the gate electrode and the control electrode of the one-transistor floating-body DRAM cell device are disposed to be in parallel to or in intersection with each other.

17. The cell array of claim 16, wherein sources of two cell devices which are formed on an isolated single-crystalline silicon film are commonly connected to each other.

18. The cell array of claim 16, wherein the control electrodes of the cell devices in the cell array are electrically isolated from each other.

19. The cell array of claim 16, wherein the control electrodes of the cell devices which are arrayed in a row in a direction of intersecting the gate electrodes in the cell array are electrically connected to each other.

20. The cell array of claim 16, wherein the control electrodes of the cell devices which are disposed to be parallel to the gate electrodes in the cell array are electrically connected to each other.

21. A one-transistor floating-body DRAM cell device comprising:
a semiconductor substrate;
a source which is formed on the semiconductor substrate;
a floating body which is formed on the source;
a drain which is formed on the floating body;
a gate insulating layer which is formed on a first side surface of a vertical structure constructed with the floating body, the source, and the drain;
a gate stack which includes at least a charge storage node and is formed on a second side surface of the vertical structure which is opposite to the first side surface of the vertical structure;
a gate electrode which is formed on a second side surface of the gate insulating layer which is opposite to a first side surface of the gate insulating layer which is in contact with the vertical structure;
a control electrode which is formed on the second side surface of the gate stack which is opposite to the first side surface of the gate stack which is in contact with the vertical structure, the control electrode being surrounded by the gate stack, the charge storage node surrounding the control electrode; and
an insulating layer which is formed between the gate electrode and the semiconductor substrate and between the control electrode and the semiconductor substrate.

22. The one-transistor floating-body DRAM cell device of claim 21, wherein the gate stack further includes a tunneling insulating layer.

23. The one-transistor floating-body DRAM cell device of claim 21, wherein the gate stack further includes a blocking insulating layer.

24. The one-transistor floating-body DRAM cell device of claim 21, wherein the charge storage node is formed as a thin film or nano-sized dots.

25. The one-transistor floating-body DRAM cell device of claim 22, wherein the tunneling insulating layer is constructed with a single layer or with two or more of insulating layers having different work functions or band gaps.

26. The one-transistor floating-body DRAM cell device of claim 23, wherein the blocking insulating layer is constructed with a single layer or with two or more of insulating layers having different work functions or band gaps.

27. The one-transistor floating-body DRAM cell device of claim 21, wherein the control electrode is constructed with one or more of a conductive semiconductor, a metal, a metal oxide, a silicide, a two-element metal, and a metal nitride.

28. The one-transistor floating-body DRAM cell device of claim 21, wherein the control electrode is formed so as to be overlapped with portions of the source region and the drain region and with the floating body.

29. The one-transistor floating-body DRAM cell device of claim 21, wherein the control electrode is formed so as to be overlapped with the source region and the floating body or with the drain region and the floating body.

30. The one-transistor floating-body DRAM cell device of claim 21, wherein the gate electrode is constructed with one or more of a conductive semiconductor, a metal, a metal oxide, a silicide, a two-element metal, and a metal nitride.

31. The one-transistor floating-body DRAM cell device of claim 21, further comprising a word line which is electrically connected to the gate electrode.

32. The one-transistor floating-body DRAM cell device of claim 21, further comprising a bit line which is electrically connected to the drain region.

33. The one-transistor floating-body DRAM cell device of claim 21,
wherein the source is formed in a lower portion of the vertical structure, and
wherein the source is connected to the semiconductor substrate in a horizontal metal interconnection line.

34. The one-transistor floating-body DRAM cell device of claim 21, wherein the one-transistor floating-body DRAM cell device further comprises an insulating layer between the source and the semiconductor substrate so that the source and the semiconductor substrate are electrically isolated from each other.

* * * * *